US012761291B2

(12) United States Patent
Meng et al.

(10) Patent No.: US 12,761,291 B2
(45) Date of Patent: Oct. 13, 2026

(54) APPARATUS, SYSTEM AND METHOD FOR MONITORING A PIT LID

(71) Applicant: TELSTRA CORPORATION LIMITED, Melbourne (AU)

(72) Inventors: Xiangyue Meng, Melbourne (AU); Himagna Erla, Melbourne (AU); Lachlan Yichen Huang, Auchenflower (AU); Halasya Siva Subramania, Melbourne (AU); Shailin Sehgal, Melbourne (AU); Sathyanarayanan Chandrasekharan, Melbourne (AU); Cristian Danci, Melbourne (AU)

(73) Assignee: TELSTRA CORPORATION LIMITED, Melbourne (AU)

( * ) Notice: Subject to any disclaimer, the term of this patent is extended or adjusted under 35 U.S.C. 154(b) by 169 days.

(21) Appl. No.: 18/561,618

(22) PCT Filed: May 16, 2022

(86) PCT No.: PCT/AU2022/050465
§ 371 (c)(1),
(2) Date: Nov. 16, 2023

(87) PCT Pub. No.: WO2022/241508
PCT Pub. Date: Nov. 24, 2022

(65) Prior Publication Data
US 2024/0272242 A1 Aug. 15, 2024

(30) Foreign Application Priority Data
May 17, 2021 (AU) ................................ 2021901472

(51) Int. Cl.
*G01R 33/00* (2006.01)
*E02D 29/14* (2006.01)

(52) U.S. Cl.
CPC ..... *G01R 33/0029* (2013.01); *E02D 29/1481* (2013.01); *G01R 33/0005* (2013.01)

(58) Field of Classification Search
CPC . G01V 3/00; G01V 3/08; G01V 3/081; E02D 29/14; E02D 29/1481;
(Continued)

(56) References Cited

U.S. PATENT DOCUMENTS 3,764,223 A * 10/1973 Lucero ................ E01C 23/0953 324/327
7,002,481 B1 * 2/2006 Crane .................... G08B 25/08 73/317
(Continued)

FOREIGN PATENT DOCUMENTS

CN 2023415057 U 1/2014
CN 210766889 U * 6/2020

OTHER PUBLICATIONS

International Search Report for Application No. PCT/AU2022/050465, mailed Sep. 6, 2022 (5 pages).

*Primary Examiner* — Huy Q Phan
*Assistant Examiner* — David B Frederiksen
(74) *Attorney, Agent, or Firm* — NIXON PEABDODY LLP; Jeffrey L. Costellia

(57) ABSTRACT

An apparatus for monitoring a pit lid of a pit, including a magnetic sensor for measuring the strength of a magnetic field, wherein when the apparatus is installed on the pit lid, the measured magnetic strength indicates whether the apparatus is in proximity to a magnet disposed in the pit. The apparatus is configured to determine, based at least partially on the magnetic strength measured by the magnetic sensor, a status of the pit lid, the status indicating whether the pit lid is closed.

18 Claims, 6 Drawing Sheets

(58) Field of Classification Search
CPC ............ G01R 33/0005; G01R 33/0017; G01R 33/0023; G01R 33/0029; G01R 33/02; G01R 33/038; G01R 33/06; G01R 33/07; G01R 33/09
See application file for complete search history.

(56) References Cited

U.S. PATENT DOCUMENTS

| | | | | |
|---|---|---|---|---|
| 10,280,587 | B2 * | 5/2019 | Nachyla | E02D 29/1427 |
| 2005/0196239 | A1 * | 9/2005 | Dennis | E02D 29/1427 404/25 |
| 2008/0165001 | A1 * | 7/2008 | Drake | G08B 29/24 340/550 |
| 2009/0303043 | A1 * | 12/2009 | Albahri | G08B 13/149 340/568.1 |
| 2010/0198032 | A1 * | 8/2010 | Simpson | G01N 33/48785 455/66.1 |
| 2011/0148631 | A1 * | 6/2011 | Lanham | E05B 53/003 292/159 |
| 2013/0125107 | A1 * | 5/2013 | Bandakka | H04L 67/10 717/171 |
| 2013/0212945 | A1 | 8/2013 | Lanham et al. | |
| 2019/0318165 | A1 | 10/2019 | Shah et al. | |

* cited by examiner

APPARATUS, SYSTEM AND METHOD FOR MONITORING A PIT LID

FIELD

The present invention generally relates to an apparatus, a system and a method for monitoring a pit lid, and in particular, for monitoring whether a pit lid has been perturbed from its original position. An activity level in the vicinity of the pit lid may also be monitored.

BACKGROUND

Pits (also known as "manholes") are used in urban and rural areas for providing access to various infrastructure. For example, a communication pit may be used for accessing communication cables or equipment. A large number of these pits are located in public areas. Due to logistical and economic reasons, these pits may not be locked or monitored, which poses a variety of hazards to the general population.

Systems and/or devices for monitoring pits have been proposed. Some existing monitoring devices have motion detection functions and can trigger an alarm when the device (installed or attached to a pit) is moved. However, those devices cannot reliably recognise or determine whether the pit is closed properly, and thus do not provide sufficient information for detecting a potential hazard. Also neither of these types of devices are able to provide insights about the activity level in the vicinity of or around the pit lid. Some other known systems require the installation of mechanical switches inside a pit, which may increase the cost of labour in introducing such systems, and may affect the reliability and robustness of the system in the long term due to mechanical fatigue failure of those switches.

It is desired to address or ameliorate one or more disadvantages or limitations associated with the prior art, or to at least provide a useful alternative.

SUMMARY

An embodiment of the present invention provides an apparatus for monitoring a pit lid of a pit, including:

a magnetic sensor for measuring the strength of a magnetic field, wherein when the apparatus is installed on the pit lid, the measured magnetic strength indicates whether the apparatus is in proximity to a magnet disposed in the pit; wherein the apparatus is configured to determine, based at least partially on the magnetic strength measured by the magnetic sensor, a status of the pit lid, the status indicating whether the pit lid is closed.

Another embodiment of the present invention provides a system for monitoring a pit lid of a pit, including the above-described apparatus.

A further embodiment of the present invention provides a method for monitoring a pit lid of a pit, including:

measuring, by using a magnetic sensor, the strength of a magnetic field in the vicinity of a monitoring apparatus installed on the pit lid, the measured magnetic strength indicating whether the monitoring apparatus is in proximity to a magnet disposed in the pit; and determining, based at least partially on the magnetic strength measured by the magnetic sensor, a status of the pit lid, the status indicating whether the pit lid is closed.

A further embodiment of the present invention provides a method for monitoring a pit lid of a pit, including:

measuring, using a motion sensor of a monitoring apparatus in the pit, vibration/movement of the pit lid, the measured vibration/movement indicating an activity level in the vicinity of the pit lid;

classifying, using a machine learning process, the activity level.

BRIEF DESCRIPTION OF THE DRAWINGS

Preferred embodiments of the present invention are hereinafter described, by way of example only, with reference to the accompanying drawings, wherein.

DETAILED DESCRIPTION

A system for monitoring a pit lid to detect the open or closed status of the lid, and to initiate the corresponding actions that may be required is described with reference to the drawings. In the embodiments described below, the pit is a communication pit. Alternatively, the system may be used for remotely monitoring other suitable types of pit lids, such as pit lids for public utility or private asset, e.g., water, sewers, electricity, drains, or gas.

The monitoring system includes a monitoring apparatus taking the form of a battery-powered monitoring device deployed on a pit lid (the lid may be of any size suitable for covering a pit), for monitoring the open or closed status of the lid using magnetic proximity sensing. The monitoring results may be used for taking pre-emptive actions prior to the occurrence of potential incidents (such as a public hazard). The monitoring device may detect, for example, open, closed, or tilted status of the pit lid. Some of these types of status may indicate unauthorised access, or potential theft of either the lid itself or objects accommodated within the pit.

The monitoring device incorporates a combination of sensors, and uses these sensors with the aid of edge computing technology to determine whether a pit lid has been perturbed from its original position and to also monitor the activity level in the vicinity of the pit lid. The detection results may be communicated to a remote backend system, where the data is further processed to determine whether further actions are required.

Figure 1:
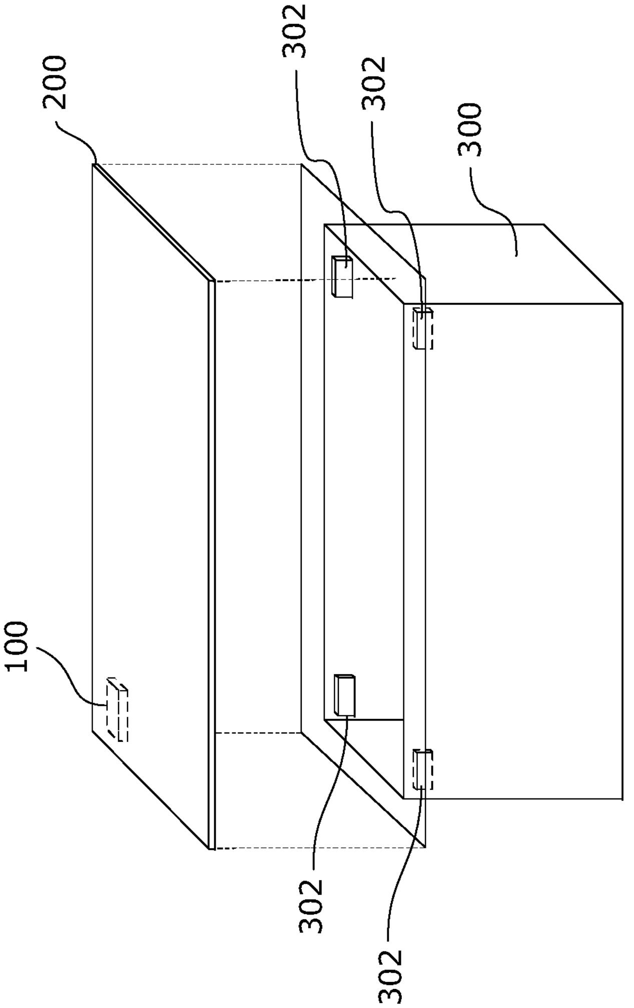
FIG. 1 is a schematic diagram showing an example of a monitoring device attached to a pit lid, according to an embodiment of the present disclosure.

FIG. 1 shows an example of such a monitoring device 100 attached to a pit lid 200. The pit lid 200 covers a pit 300 which has a rectangular cross-section. Correspondingly, the pit lid 200 is formed in the shape of a rectangular panel.

The monitoring device 100 is securely attached underneath the pit lid 200, preferably at a corner of the pit lid 200.

Correspondingly, at least one magnet 302 is disposed in the pit 300, e.g., attached to, embedded in, or integrated in an inner wall of the pit 300. More specifically, the magnet 302 is aligned with or located close to the top edge of the pit 300, and in proximity to the corner corresponding to the corner of the pit lid 200 where the monitoring device 100 is located. In this way, when the pit lid 200 is properly closed, the monitoring device 100 is located in proximity to the magnet 302.

The magnet 302 is preferably a permanent magnet, which, unlike an electromagnetic magnet, does not require the application of an electric current to maintain its magnetic properties. The magnet 302 may be made of a rare-earth material, e.g., neodymium, which generates a strong local magnetic field that can cover a cylinder of a few centimetres in diameter.

Optionally, more than one magnet 302 may be provided in the pit 300. For example, as shown in FIG. 1, four magnets 302 may be secured inside the pit 300, one on each corner. The four magnets 302 are located in proximity to the top edge of the pit 300. Such an arrangement provides the advantage that, when the pit lid 200 is closed, one of the four magnets 302 will be in proximity to the monitoring device 100 regardless of which corner of the pit 300 the monitoring device 100 is facing. Alternatively, two magnets 302 may be secured inside the pit 300 on two opposite corners respectively.

As described in further detail below, the monitoring device 100 uses magnetic proximity sensing to determine whether it is in proximity to any of the magnets 302, which indicates whether the pit lid 200 is properly closed.

Figure 3:
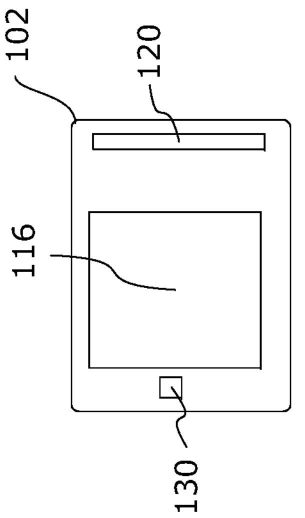
FIG. 2 and FIG. 3 are schematic diagrams showing an exemplary structure of the monitoring device.
Figure 2:
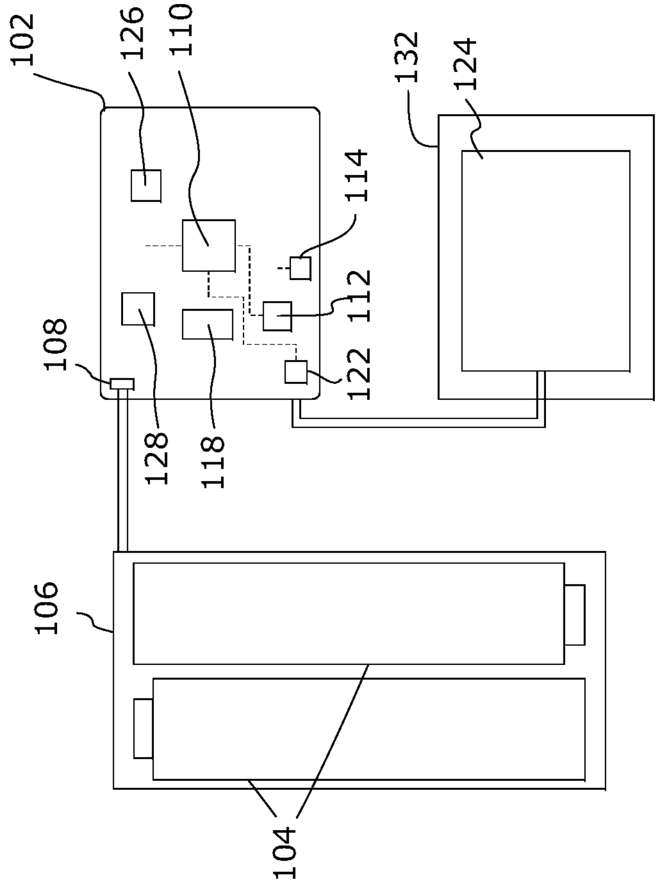

The monitoring device 100, as shown in FIGS. 2 and 3, has a first PCB board 102, powered by two AA batteries 104. The two AA batteries 104 are accommodated in a battery holder 106, which is electronically connected to the PCB board 102 via a battery connector 108.

The monitoring device 100 has a microcontroller (also referred to below as the "MCU") 110, a motion sensing module 112, and a magnetometer 114.

The MCU 110 runs Real-Time Operating System (RTOS) to coordinate software tasks. As described in further detail below, the functions of MCU 110 include, e.g., periodically collecting telemetry data and controlling the telemetry data to be reported back to a backend system, sending an alarm to the backend system if the pit lid 200 is detected to be open, and clearing the alarm in the backend system if the pit lid 200 is detected to be restored to a closed status.

The motion sensing module 112 includes at least one motion sensor for detecting the movement of the monitoring device 100. The motion sensor may take the form of an accelerometer, for instance. Alternatively or additionally, the motion sensor may include a gyroscope, and/or other suitable type(s) of sensor that allows for detection of the movement of the monitoring device 100. In some embodiments, the motion sensor may be a composite sensor of accelerometer and gyroscope.

The motion sensing module 112 includes an internal data processing logic, for example, data processing logic including a machine learning module that executes a machine learning ("ML") algorithm. That is, the motion sensing module 112 allows for a sensor-level ML process to be performed. The motion sensing module 112 is a System-in-Package (SiP) unit. As an example, LSM6DSOX from STMelectronics may be used as the motion sensing module 112. LSM6DSOX contains a digital accelerometer and a digital gyroscope, together with a machine-learning core which is programmable to run an ML algorithm (in the form of a decision tree). The motion sensing module 112 further includes a data interface (which may be referred to as a "sensor hub") that is configured to read the output of one or more external sensors, including the magnetometer 114. The output from the external sensor(s) is then passed to the machine learning module of the motion sensing module 112.

The monitoring device 100 further includes one or more communication units for communication with external devices, e.g., a radio-frequency (RF) communication unit for wireless communication with a remote server. The RF communication unit includes an RF module 116, a chip SIM card 118, and an RF chip antenna 120.

The one or more communication units may further include a near-field communication (NFC) unit for enabling NFC communication with an external device. The NFC unit may include an NFC controller 122 and an NFC antenna 124.

The NFC unit allows for the monitoring device 100 to communicate with a device used by a technician in the field, for example, for provisioning, decommissioning and/or debugging purposes.

The monitoring device 100 may further include one or more additional sensors, such as sensors for obtaining environmental information or information related to the working condition of the monitoring device 100, e.g., a temperature and humidity sensor 126 for collecting temperature and/or humidity data which, as described in further detail below, may be reported periodically to the remote server.

The monitoring device 100 further includes a buck converter 128 and a boost converter 130. The buck converter takes the input from the two AA batteries 104 (2×1.5V=3V) and converts it to 1.8V for powering the MCU 110. The boost converter takes the input from the two AA batteries 104 (3V) and converts it to 3.8V for powering the RF module 116.

As shown in FIG. 2, the MCU 110, the motion sensing module 112, the magnetometer 114, the temperature and humidity sensor 126, the NFC controller 122, the buck converter 128 and the chip SIM card 118 may be located on the top side of the first PCB board 102. The RF module 116, the RF chip antenna 120 and the boost converter 130 may be located on the bottom side of the first PCB board 102. The NFC antenna 124 is located on a second PCB board 132 and is printed on a flexible PCB 132. The first PCB board 102 and the second PCB board 132 are connected via one or more board-to-board connectors. The battery holder 106, the first PCB board 102, and the second PCB board 132 together are accommodated in a plastic housing (not shown), which can be securely attached to or embedded in the pit lid 200.

After the initial deployment in the field (i.e., installed to the pit lid 200), the monitoring device 100 measures the strength of the local magnetic field where it is located. The measurement is performed by the magnetometer 114 under the control of the MCU 110.

The measured magnetic strength is retained by the monitoring device 100, and is retained in a training phase by the decision tree of the machine-learning core in the motion sensing module 112. The decision tree is trained on known data to classify the outputs (e.g. High=Closed; Low=Opened)

After the initialization, the rest of the monitoring device 100 switches to a low-power sleep mode except the motion sensing module 112. The motion sensing module 112 uses its motion sensor (e.g., taking the form of an accelerometer) to monitor any potential movement of the monitoring device 100, and generates an interrupt to wake up the MCU 110 upon detection of a movement.

The movements initially detected by the accelerometer may include significant movements of the pit lid 200 (indicating that the pit lid 200 is removed, intentionally or unintentionally, from a closed position) as well as occasional vibrations of the pit lid 200. In order to identify a significant movement (rather than minor or occasional vibrations) of the pit lid 200, the initial detection result of the accelerometer is processed to filter out minor or occasional vibrations. The identification of a significant movement is performed by the machine learning module in the motion sensing module 112.

A machine learning algorithm is executed for classifying the output of the accelerometer into three categories, representing three states of the pit lid respectively: Movement (indicating significant movement of the pit lid), Activity (anything that touches the lid but doesn't displace it e.g., people walking) and Stationary (indicating that the pit lid is not moving, or with only minor or occasional vibration). The machine learning algorithm uses a decision tree to perform the classification, wherein each decision boundary is learned (extracted) from field data in a training phase.

Upon detection of a significant movement of the pit lid 200 (i.e., when the output of the motion sensing module 112 is classified into a "Movement" state), the motion sensing module 112 generates an interrupt that wakes up the MCU 110. The MCU 110 records the event and wakes up the magnetometer 114 to measure the strength of the local magnetic field.

Alternatively, an interrupt may be generated to wake up the MCU 110 upon detection of any type of movement (i.e., either significant movement or occasional vibration) of the pit lid 200, while different types of movement may trigger different actions of the MCU 110. For example, if the movement is classified (e.g., by the ML algorithm in the motion sensing module 112) as vibration, after being woken up by the motion sensing module 112, the MCU 110 records the event and goes back to sleep. No further action is required. If the movement is classified as a significant movement, the MCU 110 then wakes up the magnetometer 114. The magnetometer 114 then measures the strength of the local magnetic field.

Upon detection of activity state of the pit lid 200 (i.e., when the output of the motion module is classified into a "Activity" state), a counter inside the motion sensing module 112 is incremented by using a Finite State Machine (FSM) of the motor sensing module 112, without having to wake up the MCU 110. The MCU 110 periodically reads this counter, clears it and generates Activity telemetry data representing the read value of the counter. This Activity telemetry data is then reported to the backend system along with other periodic measurements.

The output from the magnetometer 114 is then assessed for determining the status of the pit lid 200, e.g., if the pit lid 200 is open or closed.

Additional types of status for the pit lid 200 may be defined and identified, e.g., if the pit lid 200 is tilted, partially open, or closed but spun or rotated 180 degrees on its central vertical axis.

When the pit lid 200 is open, the magnetic strength detected by the magnetometer 114 will be significantly lower than when the pit lid 200 is closed (i.e., the magnetic strength obtained in the initialization process), as the monitoring device 100 is located away from the magnet 302 disposed in the pit 300.

As mentioned above, the rare-earth material (e.g., neodymium) of the magnet 302 allows for the generation of a strong local magnetic field (e.g., 20000~50000 mGauss) that covers a cylinder of a few centimetres in diameter. This provides a stable and precise reference for determining the position of the monitoring device 100, and hence the status of the pit lid 200. When the pit lid 200 is open, or perturbed from its correct position, the reading of the magnetometer 114 on the monitoring device 100 is approximately the same as the strength of the earth magnetic field, which indicates that the device is a distance away from the position of the magnet 302, even if a few centimetres off the position. When the pit lid 200 is closed, the magnetometer 114 is in the vicinity of the local magnetic field of the magnet, thus the reading (e.g., 20000~50000 mGauss) is an order of magnitude larger than the reading of the earth magnetic strength (e.g., 1000~3000 mGauss), which is sufficiently strong to be differentiated from the low value.

The determination of the status of the pit lid 200 (open/closed) is also performed by the machine learning module in the motion sensing module 112. The motion sensing module 112 includes a data interface that is configured to read the output of the external sensors. The output from the magnetometer 114 is fed into this data interface, which is then passed to the internal machine learning module of the motion sensing module 112 where a machine learning algorithm is executed.

Based on the readings of the magnetometer 114, the machine learning algorithm classifies the status of the pit lid 200 into one of the predefined types of status, e.g., open or closed. The machine learning algorithm uses use a decision tree to perform the classification, where each decision boundary is learned (extracted) from field data in a training phase.

In this way, the machine learning module of the motion sensing module 112 performs both the tasks of: (1) identifying significant movements of the pit lid 200; and (2) recognising the current status of the pit lid 200 (e.g., open/closed/activity). This arrangement not only allows for efficient utilisation of limited hardware resources in the monitoring device 100, but also reduces the power consumption of the monitoring device 100. It also means that no machine learning capability is required at the MCU level, or anywhere else in the monitoring device 100, such that the overall size and the production cost of the monitoring device 100 is reduced.

The classification result output by the machine learning module is sent by the motion sensing module 112 to the MCU 110. If it is confirmed that the pit lid 200 is not properly closed (e.g., if it is open), the MCU 110 triggers the RF module 116 to send an alarm to a remote server via the RF chip antenna 120.

The remote server is a cloud-based server and part of a backend system that performs further analysis and utilisation of the data collected from the monitoring device 100, and controls or triggers various action(s) required in response to the status of the pit lid 200 detected by the monitoring device 100. These actions include pre-emptive actions to avoid or diminish the occurrence of potential incidents (such as a public hazard).

For example, if a pit lid is open in a busy area for more than a predetermined number of hours, a work order is automatically generated for a field technician to visit the pit. In addition, the count of the Activity telemetry data helps in differentiating between pits in high traffic areas versus low traffic areas, and thus, prioritise work orders.

In the backend system, dashboards are used to monitor the pit infrastructure. Configuration commands can be generated and transmitted to the monitoring device 100, triggered either manually or automatically.

The monitoring device 100 communicates with the remote server using the Message Queuing Telemetry Transport (MQTT) protocol. Communication between the monitoring device 100 and the remote server is conducted over a Narrowband Internet of Things (NB-IoT) network. NB-IoT is a 4G cellular-based wireless technology catering for low-power wide-area-networks (LPWANs) that is characterised by low data rates and low bandwidth. Lower bandwidth allows for cost-effective (in both bandwidth usage and power consumption) communications compared to full-blown 4G LTE or Cat-M1. In addition, NB-IoT also provides a high coverage capability compared to LTE, which is particularly advantageous in areas with challenging radio conditions, and therefore ensures the reliability of the monitoring of pit lids in various areas and conditions.

The NB-IoT connectivity is enabled by the RF chip antenna 120. To reduce the overall size of the device, an embedded chip SIM card 118 (MFF2 form factor) is provided on the PCB board 102 to support identification and authentication for the NB-IoT connectivity. The embedded chip SIM card 118 is connected to the RF module 116 on the bottom side of the PCB board 102.

Using the NB-IoT network, the monitoring device 100 reports back to the remote server immediately when the pit lid 200 is detected to be open (which means that the pit lid 200 is removed, either intentionally or unintentionally, from the pit 300).

In addition, the monitoring device 100 may also be configured to detect restoration of the pit lid 200 (that is, when the pit lid 200 is correctly placed back, such that it has a closed status again after an open status), and to report the restoration to the remote server. The monitoring device 100 is also configured to keep track of the intervals between wakeups of the MCU 110 as an indicator of the level of activity around the pit. The level of activity around the pit detected by the monitoring device 100 may be used for setting or adjusting the sensing frequency and/or the communication frequency of parameter data, as described in further detail below.

Two types of data are transmitted from the monitoring device 100 to the remote server. One is parameter data (which may also be referred to as "telemetry data") collected from the various sensors and components of the monitoring device 100, representing the working condition and/or environmental information of the monitoring device 100. The parameter data includes, e.g., temperature and/or humidity data detected by the temperature and humidity sensor 126, magnetic strength detected by the magnetometer 114, voltage of the battery, signal quality of the RF communication. The parameter data is collected by the MCU 110, and periodically reported back to the remote server.

The other type is event-based data, including e.g., alarms (which indicates the abnormality of the pit lid 200), logging events, and/or boot events.

The sensing frequency and the communication frequency of parameter data may be pre-selected. A real-time clock inside the MCU keeps the pace. Preferably, the sensing frequency and the communication frequency may be configured to be adjustable, e.g., triggered by configuration updates received from the remote server, as described below.

Since RF communication is the most power-consuming feature in the monitoring device 100, the communication frequency is selected to achieve a balance between timely communication with the remote server and low power consumption. For example, the communication of parameter data may be set to be performed once per day, once every two days, or once a week. The sensing and/or communicating frequency may also be determined based on the location of the pit, e.g., whether the pit is in a busy urban area or a remote area. For example, pits located in urban areas may have a higher sensing and/or communicating frequency than pits located in remote areas. As described above, the monitoring device 100 is configured to keep track of the intervals between wakeups of the MCU 110, which indicates the level of activity around the pit. This information may also be used for determining or adjusting the sensing frequency and/or communication frequency of the parameter data. For example, the sensing frequency and/or communication frequency may be reduced if there are long intervals between wakeups of the MCU 110, which indicates a low level of activity around the pit. These arrangements allow for further reduction of power consumption of the monitoring device 100, and therefore results in longer battery life.

Two processes are run on the device 100 to send telemetry data to the remote server, as explained further below. One is periodic where a sampling and a reporting interval is configured on the device 100 where the device wakes every sampling interval and records a sample of telemetry, stores it in flash memory of the device 100 and goes to sleep. The device wakes up every reporting interval and sends the samples stored in the flash memory to the remote server. The second process is event driven where the device 100 wakes up immediately if it senses movement and goes through the procedure to understand whether the pit is open or closed and sends an event immediately to the remote server reporting the status of the pit lid.

The monitoring device 100 can also receive downlink commands from the remote server, e.g., configuration updates, firmware updates or reboot. Configuration updates include changing the sensing frequency and/or communication frequency, changing the host URL of the remote server, pushing a new ML model, etc.

Remote firmware updates allow security loopholes and bugs to be plugged, even if they are discovered in a later stage during the lifetime of the device, and/or if the device is already in use.

The NFC antenna 124 in combination of the NFC controller 122 provides a wireless communication channel for field deployment, such as activation, bootstrapping, and debugging of the monitoring device 100. With an NFC-enabled smartphone and a dedicated app on the smartphone, a field technician is able to perform these tasks without any wired link to the monitoring device 100, which enables the monitoring device 100 to be fully covered and thus protected from environmental elements.

Figure 4:
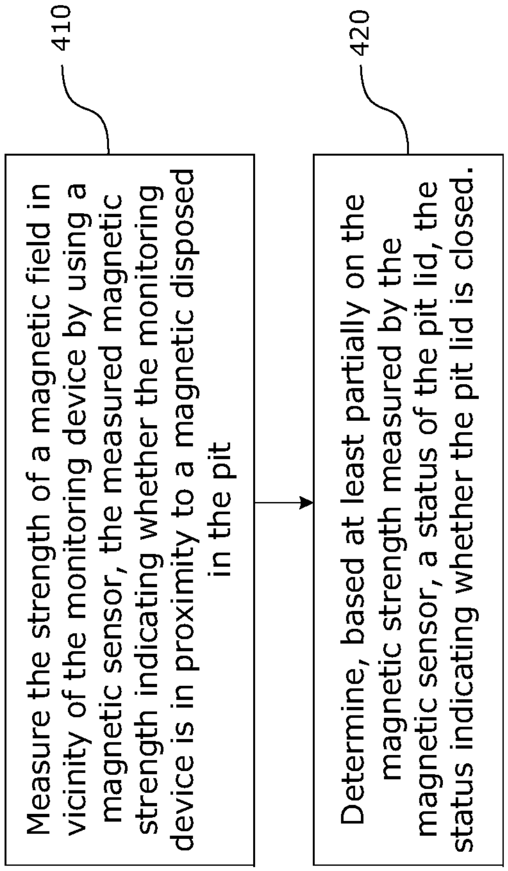
FIG. 4 shows an example of a method for monitoring a pit lid executed by the monitoring device.

FIG. 4 shows an example of a method for monitoring a pit lid of a pit, executed by the monitoring device 100. As described above, the monitoring device 100 is installed on the pit lid 200 covering the pit 300. At step 410, the monitoring device 100 measures the strength of a magnetic field in the vicinity of the monitoring device 100 by using a magnetic sensor, the measured magnetic strength indicating whether the monitoring device 100 is in proximity to a magnet disposed in the pit 300. At step 420, the monitoring device 100 determines, based at least partially on the magnetic strength measured by the magnetic sensor, a status of the pit lid 200, the status indicating whether the pit lid 200 is closed.

Figure 5:
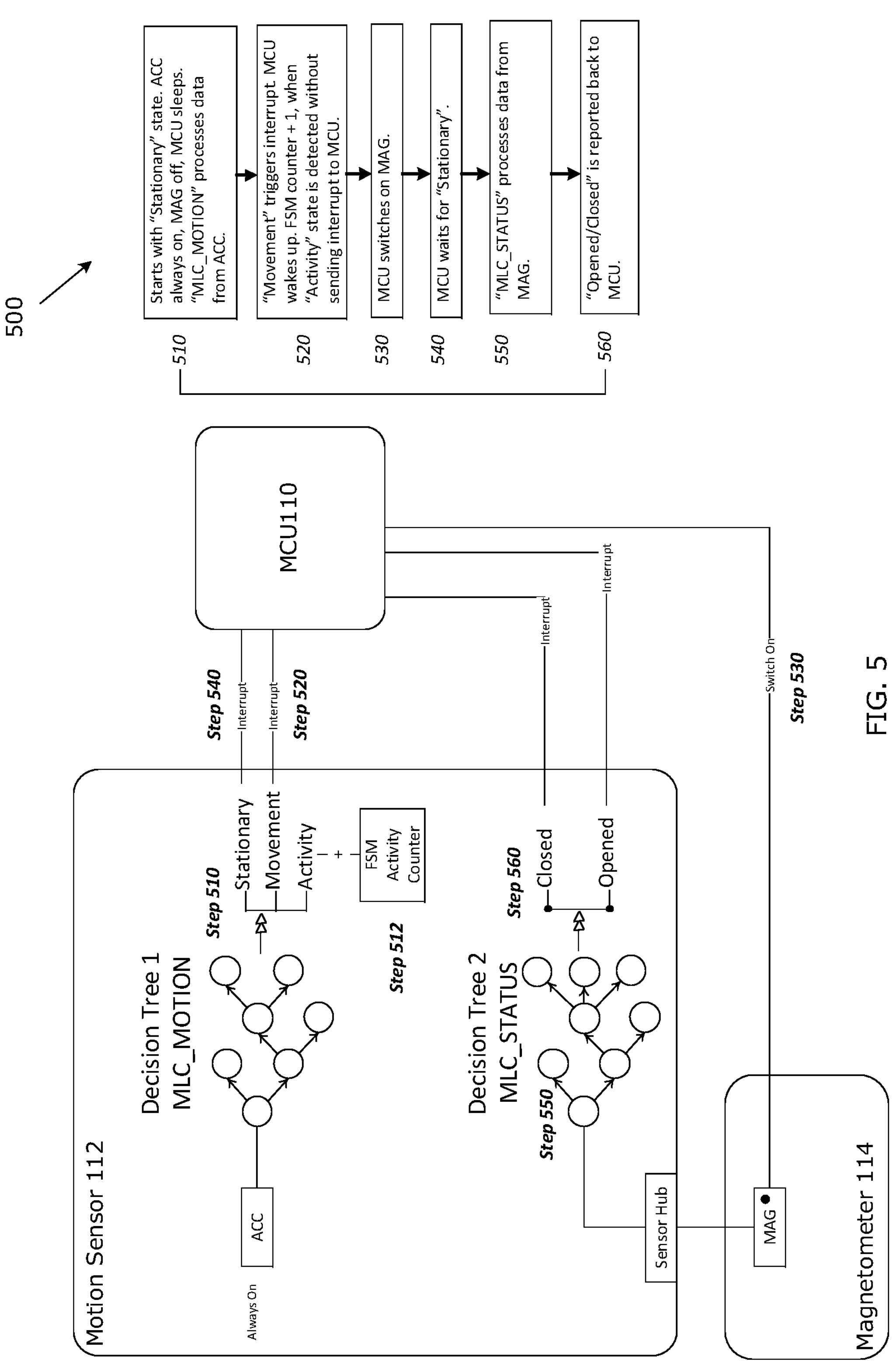
FIG. 5 is a diagram showing a more detailed example of a workflow executed by the monitoring device for monitoring a pit lid.

In particular, the process 500 executed by the monitoring device 100 for monitoring a pit lid is illustrated in FIG. 5. The motion sensing module 112 has two embedded decision trees: "MLC_MOTION" and "MLC_STATUS".

A first decision tree "MLC_MOTION" is used for processing the output of the accelerometer ("ACC") to determine the state of the pit lid 200 (Stationary/Movement/Activity). The state "Stationary" is defined as the pit lid 200 having no visual/audible wobbling, but possibly with minor background vibrations (e.g., caused by heavy vehicles, road construction and maintenance, etc.). The state "Movement" is defined as the pit lid 200 showing significant continuous displacement. The "Activity" state is defined as when the pit lid 200 is in physical contact with an external object (e.g., people walking) causing vibration which does not displace the pit lid 200. The Activity count obtained by the FSM 512 can be used for differentiating between pits in high traffic areas versus low traffic areas.

A second decision tree "MLC_STATUS" is used for determining the status of the pit lid 200 (Open/Closed) based on the output of the magnetometer 114 ("MAG"). For instance, a "Closed" status is defined as when the pit lid 200 fully fits on the top edge of the pit 300. An "Opened" status is defined as when the pit lid 200 is at least partially off the top opening of the pit lip 300.

At step 510, starting with a "Stationary" state of the pit lid 200, the motion sensing module 112 including the accelerometer (ACC) is turned ON and kept running to continuously monitor the pit lid 200. The magnetometer 114 ("MAG") is turned off, and the microcontroller (MCU) 110 is turned into a power-saving sleep mode. The first decision tree "MLC_MOTION" embedded in the Motion sensing module 112 processes the output from the accelerometer ACC and classifies the output into the "Stationary", "Movement" or "Activity" state of the pit lid 200.

When the first decision tree "MLC_MOTION" detects a "Movement" state of the pit lid 200, the workflow proceeds to step 520, where an interrupt is triggered to wake up the MCU 110. This causes an increment of a counter maintained by the MCU 110 (Counter+1). The MCU 110 also maintains a record of the intervals between MCU wakeups as an indicator of the level of activity around the pit 300. When "MLC_MOTION" detects an "Activity" state of the pit lid 200 the Motion Sensor 112 increments at step 512 an internal counter using its FSM (Finite State Machine) without sending any interrupt to wake the MCU 110. As part of the telemetry sampling task, the MCU 110 wakes up periodically reads the FSM counter value and clears it back to zero. These sampled counter values are stored in flash memory of the MCU 110 along with the respective timestamps and are sent to the remote server in the cloud as part of the telemetry reporting task as defined by the reporting interval.

Next, at step 530, the MCU 110 switches the magnetometer 114 ("MAG") ON to measure the strength of the local magnetic field.

While the magnetometer 114 ("MAG") is ON, the MCU 110 waits (at step 540) for the first decision tree "MLC_MOTION" to report a "Stationary" state of the pit lid 200.

Once a "Stationary" state of the pit lid 200 is detected by the first decision tree "MLC_MOTION" (based on the output of the accelerometer "ACC"), the workflow proceeds to step 550 where the second decision tree "MLC_STATUS" operates to process the data output from the magnetometer 114 ("MAG") to determine the status (Open/Closed) of the pit lid 200.

At step 560, the detected status (Open/Closed) of the pit lid 200 is reported back to the MCU 110. The MCU 110 may trigger further actions in response to the detected status of the pit lid 200. For example, an alarm signal may be sent to the remote server immediately when the pit lid 200 is detected to be open (which indicates that the pit lid 200 is removed, either intentionally or unintentionally, from the pit 300). In addition, the MCU 110 may also be configured to report the restoration of the pit lid 200 (that is, when the pit lid 200 is correctly placed back, such that it has a closed status again after an open status) to the remote server. The remote server may then trigger various actions upon receiving the report from the MCU 110, as described above.

As described above, the identification of a significant movement and the determination of the status of the pit lid 200 (open/closed) are performed by the machine learning module in the motion sensing module 112. For each of these two tasks, the machine learning algorithm may use a decision tree trained based on field data.

Figure 6:
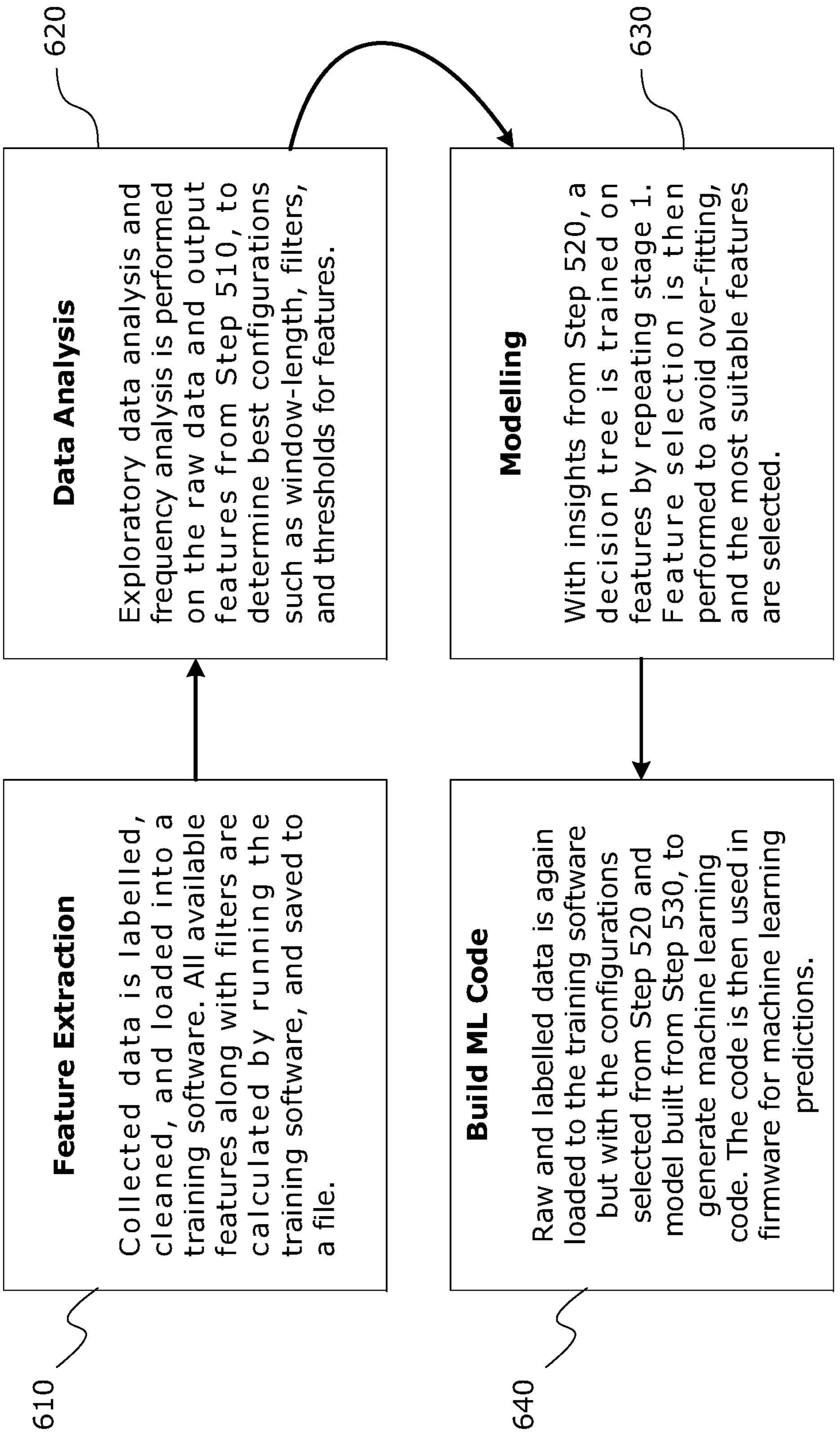
FIG. 6 illustrates an exemplary process of training a decision tree for a machine learning module of the monitoring device.

FIG. 6 illustrates the process of training a decision tree for the machine learning module in the motion sensing module 112. This process may be used for training the machine learning module for the identification of a significant movement, or for the determination of the status of the pit lid 200, depending on the data used.

At step 610 (Feature Extraction), data collected from field experiments is labelled, cleaned, and loaded into a training software. All available features along with filters are calculated by running the training software, and saved to a file.

At step 620 (Data Analysis), exploratory data analysis and frequency analysis is performed on the raw data and output features from step 610, to determine the best configurations such as window-length, filters, and thresholds for the features.

At step 630 (Modelling), with insights from step 620, a decision tree is trained on features by repeating stage 1. Parameter tuning and feature selection are then performed to avoid over-fitting, enhance accuracy of prediction and derive an optimal model with the most suitable features selected.

At step 640 (Build ML Code), raw and labelled data is again loaded to the training software but with the configurations selected from step 620 and model built from step 630, to generate machine learning code. The code is then used in firmware for machine learning predictions.

As described above, the IoT-based monitoring system includes a monitoring device that uses magnetic proximity sensing to reliably detect the open/closed status of the pit lid, where a permanent magnet is installed inside the pit, right below the device such that the device can detect a strong magnetic field only when the pit lid is properly closed.

The monitoring device utilises a motion sensing module that is "always-on", and leverages edge computing on the sensor level to enable continuous monitoring of the pit lid without aid from the MCU, which reduces the overall power consumption.

The monitoring system and device address a number of technical challenges in monitoring the open/closed status of pit lids. Firstly, as the system is required to monitor a large number of pit lids located in various areas and conditions, there are limited options for powering the monitoring device. While batteries can be a reliable power source that fits into a compact monitoring device, due to the massive number of pit lids to be monitored, periodically replacing the battery is not practical, particularly given that the device is desired to monitor the pit lid without any interruption for a long period of time.

To this end, the monitoring device described herein uses sensor-level machine learning which permits an "always-on" artificial intelligence (AI) processes to process raw data in real-time without significant power consumption. By running an edge computing process on the sensor level, continuous monitoring of the pit lid can be achieved without invoking any assistance from the MCU until an event of interest is detected. Upon detection of an event of interest, the motion sensing module then generates an interrupt to the MCU, which wakes up the MCU from sleep mode. The MCU subsequently triggers the assessment of the detected data and takes actions accordingly, e.g., sending an alarm to the remote server if the pit lid is open, or going back to sleep mode if the event is merely an occasional vibration. In this way, the monitoring device allows for continuous monitoring of the pit lid while maintaining a low power consumption, which makes it possible to efficiently and reliably monitor a large number of pit lids across various locations. For example, in the embodiments described above, the monitoring device can be powered by two AA batteries for up to 7 years without requiring battery replacement.

Secondly, existing methods (e.g., using a rule-based algorithm) for making decisions/classifications based on live sensor data can lead to a high rate of false positives and low reliability.

To improve the reliability and accuracy in handling the live sensor data, the monitoring system described herein leverages machine learning techniques to train a model, which allows for the identification of patterns in sensor data, and separation of the signal from the noise. The model takes a set of inputs (features) and outputs the desired classes (e.g., open/closed). It automatically learns the relationship between these two during the training phase. Once trained and deployed, the model is able to classify an unknown and new set of input data. This effectively reduces the rate of false positives, and thereby improves the accuracy of the monitoring result and the reliability of the monitoring system.

Another technical challenge is providing an ultra-high level of confidence in correctly recognising the status of the pit lid when a massive number of pit lids need to be monitored. Otherwise, the monitoring system may be inundated with a large number of false alarms.

To address this problem, the monitoring system uses magnetic proximity sensing to reliably detect whether the pit lid is properly closed. To this end, a permanent magnet is installed inside the pit near the device, generating a strong local magnetic field, which provides a stable and precise reference to determine the position of the device, and hence the pit lid. This provides the monitoring system with a high reliability and low false detection rate.

In the embodiments described above, both the identification of the significant movement of the pit lid and the classification of the status of the pit lid based on the measured magnetic strength are performed by the machine learning module of the motion sensing module 112, which achieves efficient utilisation of limited hardware resources in the monitoring device 100 and reduces the power consumption of the monitoring device 100.

Alternatively, in some other embodiments, these two processes may be performed by different components of the monitoring device 100, for instance, two different machine learning modules, which may or may not be embedded in the motion sensing module 112.

Further, either or both of these two processes may be performed using other types of data processing techniques rather than machine learning methods. However, as described above, using machine learning techniques allows for improved reliability and accuracy in handling live sensor data, and thereby enhances the performance of the monitoring system.

Further, in the embodiments described above, the motion sensing module 112 uses two decision trees to identify significant movements of the pit lid and to classify the status of the pit lid, respectively. More decision trees may be implemented in the motion sensing module 112 to add further features to the monitoring device 100 that may be useful in the use-case described above or other possible use-cases.

Further, in the embodiments described above, the status of the pit lid is defined to be open or closed. Alternatively, additional or alternative types of status of the pit lid may be defined, e.g., that the pit lid is partially covering the pit, that the pit lid is tilted to a specific angle or range of angle, or that the pit lid is closed but spun or rotated 180 degrees on its central vertical axis. Correspondingly, the actions taken by the monitoring device 100 and the remote server following the determination of these statuses may be defined accordingly.

Further, in the embodiments described above, based on the periodic telemetry data sent by the device 100 to the remote server a Trip Hazard status of the pit lid 200 can be determined. Trip Hazard is defined as an elevation of 15 mm or more on either the length or breadth of the pit. Identification of such a state helps to detect if the pit lid 200 is in a condition that might be a trip hazard for public. In addition, it is understood that trip hazard in most scenarios is developed over time.

Based on periodic samples of accelerometer (ACC) readings, the device 100 calculates the Pitch and Roll orientation angles using an e-compass algorithm. This data is then sent periodically to the remote server along with the other telemetry data. This orientation angle data provides insights on the changes in the tilt of the pit lid 200 along its length and breadth. Thereafter, the deviation in pitch angle, roll angle and magnetometer reading from its initial state is modelled to classify the trip hazard status of the lid. The initial state of the pit is defined as the magnetometer readings and orientation angles immediately after the most recent open or close event.

Figure 7:
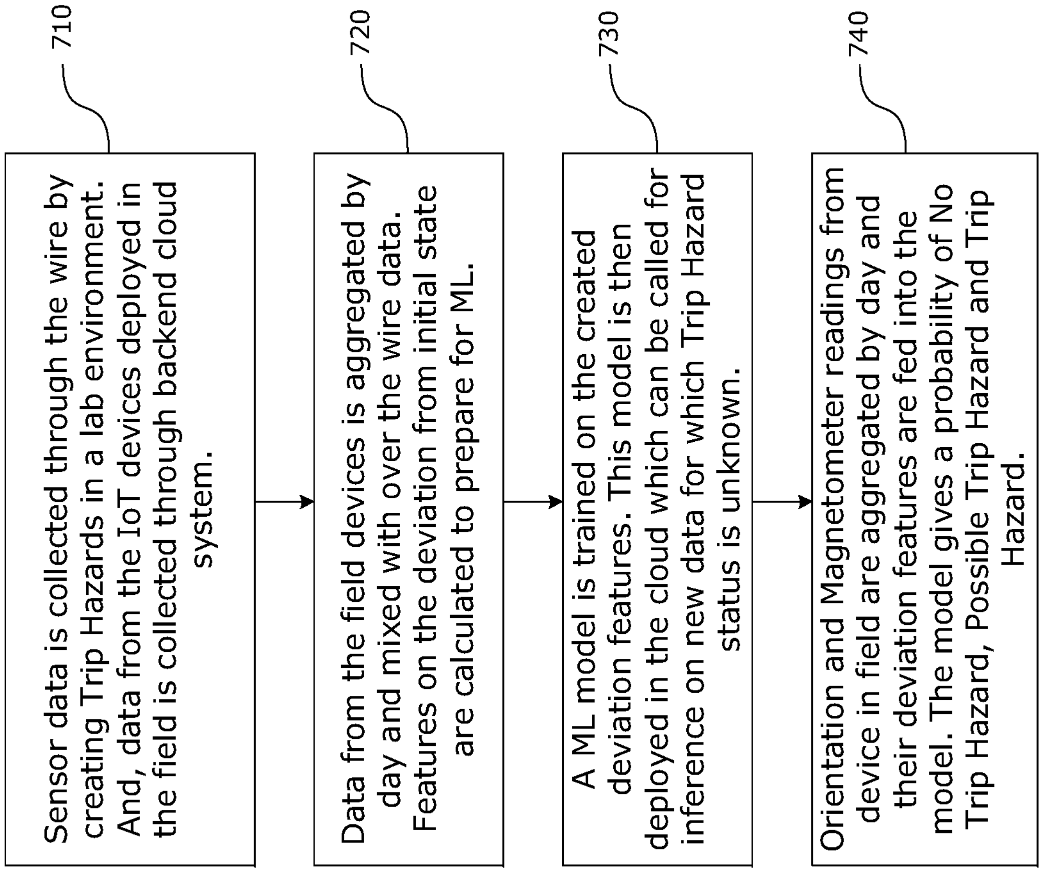
FIG. 7 illustrates an exemplary process of training a Trip Hazard detection machine learning model of the monitoring device and inferencing probabilities from the model.

FIG. 7 depicts the end-to-end process of training a Trip Hazard detection ML model and using it for inferencing detection probabilities. This process has four key steps: collecting data (710), feature creation (720), model training (730) and model inference (740).

At step 710, Trip Hazards are created in a lab by placing objects under the lid to create the elevation. Then, accelerometer and magnetometer sensor data is collected through a direct wire connection with several variations in the elevation and tilt of the pit lid 200. In addition, data from the IoT devices deployed in the field is collected through a backend cloud system that includes the remote server.

At step 720, the data from the field devices is aggregated by day and mixed with the over the wire data collected in 710. Features (inputs to ML model) on the deviation from initial state are calculated to prepare data for model training. This technique balances out the sensor drift and temperature effects on the sensor 112 and magnetometer 114.

At step 730, a Random Forest based machine learning model is trained on the features created in step 720. The model has three outputs No Trip Hazard (no visible elevation and up to 5 mm elevation of pit lid 200), Possible Trip Hazard (5 mm to 15 mm elevation of pit lid 200) and Trip Hazard (more than 15 mm elevation of pit lid 200). This model is then deployed in the remote server backend cloud system and can be called to execute inference to produce one of the outputs.

At step 740, the orientation and magnetometer telemetry samples sent by devices to the cloud system are aggregated by day and their deviation features are fed into the model. The model then, gives probabilities for the three outputs for each device 100.

Further, in the embodiments described above, the probabilities of the Trip Hazard detections may be processed to calculate confidence intervals for a period of 10 days. The maximum of the three probability intervals is calculated and alarms can be raised if a high chance of Trip Hazard is determined.

Further, in the embodiments described above, the pit 300 has a rectangular cross-section, and the pit lid 200 has a corresponding rectangular shape. However, it is to be understood that the embodiments of the present disclosure is not limited to pit and pit lid of any specific shape, as long as the pit lid can cover the pit and make the monitoring device 100 aligned with the magnet disposed in the pit when the pit lid is properly closed.

Further, in the embodiments described above, the monitoring device 100 communicates with the remote server using the MQTT protocol over an NB-IoT network. Alternatively, other IoT protocols and/or carriage technology may be used for the communication between the monitoring device 100 and the remote server.

In addition, the data communicated between the monitoring device 100 and the remote server is not limited to the types described above. Further information or signal may be transmitted from the monitoring device 100 to the remote server, and additional/alternative instructions or data may be sent from the remote server to the monitoring device 100.

Further, in the embodiments described above, the monitoring device 100 is securely attached underneath the pit lid 200. Alternatively, monitoring device 100 may be fully or partially integrated in the pit lid 200.

The reference in this specification to any prior publication (or information derived from it), or to any matter which is known, is not, and should not be taken as an acknowledgment or admission or any form of suggestion that that prior publication (or information derived from it) or known matter forms part of the common general knowledge in the field of endeavour to which this specification relates.

Many modifications will be apparent to those skilled in the art without departing from the scope of the present invention as hereinbefore described with reference to the accompanying drawings.

The invention claimed is:

1. An apparatus for monitoring a pit lid of a pit, including:
- a magnetic sensor for measuring a strength of a magnetic field, wherein when the apparatus is installed on the pit lid, the measured magnetic field strength indicates whether the apparatus is in proximity to a magnet disposed in the pit; and
- a motion sensor for continuously monitoring the pit lid to detect movements of the pit lid;
- wherein the apparatus is configured to determine, based at least partially on the magnetic strength measured by the magnetic sensor, a status of the pit lid, the status indicating whether the pit lid is closed; and
- wherein the apparatus is configured to detect activity associated with the pit lid and increment a counter in the motion sensor without turning on a microcontroller of the apparatus.

2. The apparatus of claim 1, further including:
- a motion sensing module including a motion sensor for continuously monitoring the pit lid to detect movements of the pit lid.

3. The apparatus of claim 2, wherein the measurement by the magnetic sensor is triggered at least partially based on the output of the motion sensing module.

4. The apparatus of claim 2,
- wherein the motion sensing module is configured to identify, from the detected movements of the pit lid, a significant movement of the pit lid; and
- wherein the measurement by the magnetic sensor is triggered at least partially by the identification of the significant movement of the pit lid.

5. The apparatus of claim 4, wherein the identification of the significant movement of the pit lid is performed by executing a machine learning process.

6. The apparatus of claim 4, wherein the motion sensing module further includes machine learning logic, the machine learning logic being configured to perform:
- the identification of the significant movement of the pit lid; and the determination of the status of the pit lid.

7. The apparatus of claim 6, wherein the machine learning logic further performs identification of activity in the vicinity of the pit lid.

8. The apparatus of claim 1, wherein a plurality of magnets are disposed in the pit, and the apparatus is adapted to be installed on the pit lid in the vicinity of at least one of the plurality of magnets disposed in the pit.

9. The apparatus of claim 1, further including a data communication module, for sending a signal to a remote server based on the determined status of the pit lid.

10. The apparatus of claim 9, wherein the data communication module is further configured to periodically send parameter data to the remote server, the parameter data including data that represents working condition of the apparatus or environmental information.

11. The apparatus of claim 10, wherein a frequency of periodically sending the parameter data to the remote server is determined or adjusted based on the level of activity near the pit.

12. The apparatus of claim 9, wherein the data communication module is configured to further receive incoming data from the remote server, including data related to one or more of the following: configuration updates, firmware updates, and reboot.

13. The apparatus of claim 1, further including an NFC controller to establish a wireless NFC communication channel for field activation, bootstrapping, and debugging of the apparatus.

14. A system for monitoring the pit lid of the pit, including the apparatus as claimed in claim 1.

15. The system of claim 14, further including the magnet disposed in the pit.

16. The system of claim 14, further including:
- a remote server, configured to be in wireless communication with the apparatus;
- wherein the apparatus is configured to send a signal to the remote server based on the determined status of the pit lid;
- wherein the remote server is further configured to trigger or control actions in response to the signal sent from the apparatus.

17. A method for monitoring a pit lid of a pit, including:
- measuring, by using a magnetic sensor, a strength of a magnetic field in the vicinity of a monitoring apparatus installed on the pit lid, the measured magnetic field strength indicating whether the monitoring apparatus is in proximity to a magnet disposed in the pit;

determining, based at least partially on the magnetic strength measured by the magnetic sensor, a status of the pit lid, the status indicating whether the pit lid is closed; and measuring, by using a motion sensor, movements of the pit lid for continuously monitoring movements of the pit lid;

wherein the apparatus is configured to determine, based at least partially on the magnetic strength measured by the magnetic sensor, a status of the pit lid, the status indicating whether the pit lid is closed; and wherein the apparatus is configured to detect activity associated with the pit lid and increment a counter in the motion sensor without turning on a microcontroller of the apparatus.

18. The method as claimed in claim 17, including monitoring, by classifying activity telemetry data from the apparatus, an activity level in a vicinity of the pit lid.

* * * * *